(12) United States Patent
Hisakuni et al.

(10) Patent No.: US 9,091,610 B2
(45) Date of Patent: Jul. 28, 2015

(54) ELECTRONIC APPARATUS, A METHOD FOR ESTIMATING A BREAK, AND A METHOD FOR ESTIMATING A FATIGUE LIFE

(71) Applicants: Yousuke Hisakuni, Tokyo (JP);
Takahiro Omori, Kanagawa-ken (JP);
Kenji Hirohata, Tokyo (JP)

(72) Inventors: Yousuke Hisakuni, Tokyo (JP);
Takahiro Omori, Kanagawa-ken (JP);
Kenji Hirohata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 407 days.

(21) Appl. No.: 13/722,087

(22) Filed: Dec. 20, 2012

(65) Prior Publication Data
US 2013/0312523 A1 Nov. 28, 2013

(30) Foreign Application Priority Data
May 25, 2012 (JP) .................................. 2012-120108

(51) Int. Cl.
| | |
|---|---|
| *G01M 7/00* | (2006.01) |
| *G01M 7/02* | (2006.01) |
| *G01R 31/04* | (2006.01) |
| *G01R 31/28* | (2006.01) |

(52) U.S. Cl.
CPC . *G01M 7/02* (2013.01); *G01M 7/00* (2013.01); *G01R 31/048* (2013.01); *G01R 31/2817* (2013.01)

(58) Field of Classification Search
CPC ...... G01M 7/02; G01M 7/00; G01R 31/2817; G01R 31/04; G01R 31/048; H05K 2203/162
USPC ........................................................ 73/582
See application file for complete search history.

(56) References Cited

U.S. PATENT DOCUMENTS

| | | | | |
|---|---|---|---|---|
| 5,867,809 | A * | 2/1999 | Soga et al. ..................... | 702/130 |
| 6,532,421 | B2 * | 3/2003 | Miwa ............................... | 702/34 |
| 7,171,314 | B2 * | 1/2007 | Meyer et al. .................... | 702/42 |
| 7,514,941 | B2 * | 4/2009 | Barton .......................... | 324/719 |
| 8,156,810 | B2 * | 4/2012 | Huebler et al. ................. | 73/579 |
| 8,321,157 | B2 * | 11/2012 | Omori et al. .................... | 702/34 |
| 2006/0066335 | A1 * | 3/2006 | Kang et al. ..................... | 324/760 |
| 2008/0015827 | A1 * | 1/2008 | Tryon et al. ....................... | 703/2 |
| 2010/0070204 | A1 * | 3/2010 | Monda et al. ................... | 702/35 |
| 2010/0073022 | A1 * | 3/2010 | Schnetker ...................... | 324/765 |
| 2012/0306529 | A1 * | 12/2012 | Omori et al. ............. | 324/763.01 |
| 2013/0124118 | A1 * | 5/2013 | Monda et al. ................... | 702/58 |

FOREIGN PATENT DOCUMENTS

JP     2011-109145     6/2011

* cited by examiner

*Primary Examiner* — Laura Martin
*Assistant Examiner* — Samir M Shah
(74) *Attorney, Agent, or Firm* — Finnegan, Henderson, Farabow, Garrett & Dunner, L.L.P.

(57) ABSTRACT

According to one embodiment, a first joint unit and a second joint unit are disposed with space on a heat radiation substrate. A joint area of the second joint unit is larger than that of the first joint unit. An insulated substrate is disposed on the first joint unit and the second joint unit. A corner region of the insulated substrate contacts the first joint unit. A first sensor to measure an acceleration of vibration applied to the insulated substrate is disposed thereon. The first sensor is more adjacent to the first joint unit than the second joint unit. A response spectrum of the acceleration is calculated. An extension status of joint failure of the first joint unit is decided by comparing a frequency of a maximum peak of the response spectrum with a reference frequency. A break of the second joint unit is estimated based on the extension status

8 Claims, 7 Drawing Sheets

US 9,091,610 B2

ELECTRONIC APPARATUS, A METHOD FOR ESTIMATING A BREAK, AND A METHOD FOR ESTIMATING A FATIGUE LIFE

CROSS-REFERENCE TO RELATED APPLICATION

This application is based upon and claims the benefit of priority from Japanese Patent Application No. 2012-120108, filed on May 25, 2012; the entire contents of which are incorporated herein by reference.

FIELD

Embodiments described herein relate generally to an electronic apparatus, a method for estimating a break, and a method for estimating a fatigue life.

BACKGROUND

A power module is used for an electronic apparatus which needs a switching for large current, such as in-vehicle equipment or industrial equipment. In the power module, an insulated substrate on which a circuit is formed, and a heat radiation substrate equipped by contacting a heat sink, are jointed with solder. In the electronic apparatus, a heat is conducted from the insulated substrate to the heat radiation substrate via a solder layer for the solder joint, and radiated to the heat sink.

However, with usage of the electronic apparatus, an external force such as vibration is added to the electronic apparatus, and a heat is generated at devices in the electronic apparatus. By the external force or a heat load of the heat generation, a failure such as a crack occurs at the solder layer By this failure occurred at the solder layer, a radiation performance of the electronic apparatus often falls. Accordingly, in order to maintain the radiation performance and safety of the electronic apparatus, reliability of solder joint between the insulated substrate and the heat radiation substrate is desirable to be raised.

DETAILED DESCRIPTION

According to one embodiment, an electronic apparatus includes a heat radiation substrate, a first joint unit, a second joint unit, an insulated substrate, a first sensor, a first calculation unit, a decision unit, and an estimation unit. The first joint unit is disposed on the heat radiation substrate. The second joint unit is disposed on the heat radiation substrate by spacing from the first joint unit. A joint area of the second joint unit is larger than a joint area of the first joint unit. The insulated substrate is disposed on the first joint unit and the second joint unit. A corner region of the insulated substrate contacts with the first joint unit. The first sensor measures an acceleration of vibration applied to the insulated substrate, and is disposed on the insulated substrate. The first sensor is more adjacent to the first joint unit than the second joint unit. The first calculation unit is configured to calculate a response spectrum of the acceleration. The decision unit is configured to decide an extension status of joint failure of the first joint unit by comparing a frequency of a maximum peak of the response spectrum with a reference frequency. The estimation unit is configured to estimate a break of the second joint unit based on the extension status.

Various embodiments will be described hereinafter with reference to the accompanying drawings.

Figure 1:
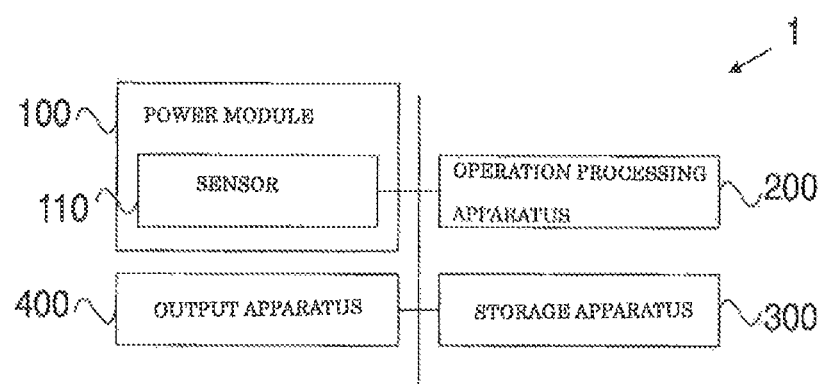
FIG. 1 is a block diagram of the electronic apparatus according to a first embodiment.

FIG. 1 is a block diagram of an electronic apparatus 1 according to the first embodiment. For example, the electronic apparatus 1 is an electronic control unit (ECU) for vehicle.

The electronic apparatus 1 includes a power module 100 having a switching function of current, an operation processing apparatus 200 such as CPU or MPU, and a storage apparatus 300 such as non-volatile memory or ADD. Furthermore, the electronic apparatus 1 includes an output apparatus 400 to inform the outside (for example, a user) of the power module being break or previous status thereof according to necessity. For example, the output apparatus informs by a sound (alarm), a display, or an electric signal. Moreover, as shown in FIG. 1, a sensor 110 (explained afterwards) in the power module 100, the operation processing apparatus 200, the storage apparatus 300, and the output apparatus 400, are electrically connected by signal lines.

Figure 2A:
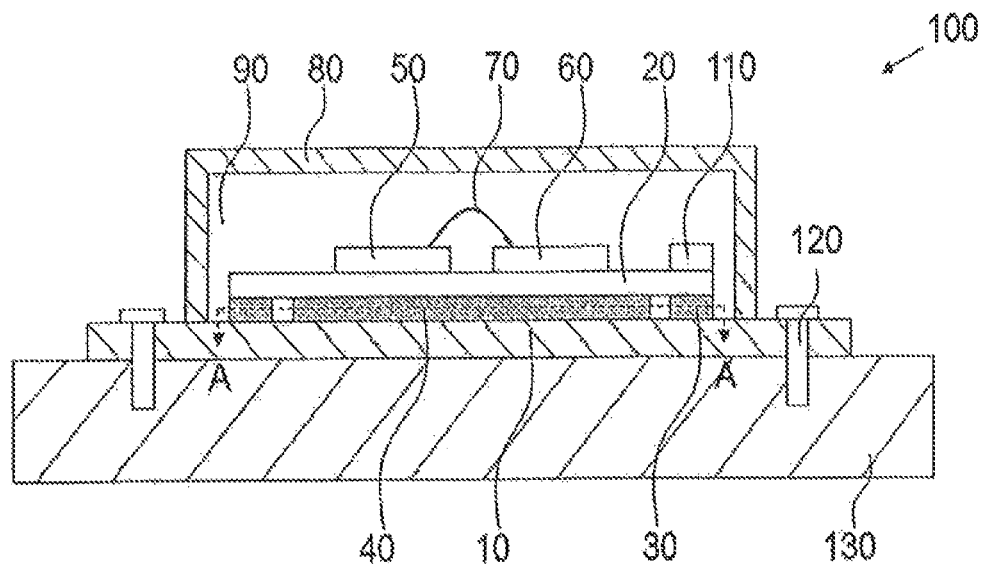
FIGS. 2A and 2B are a schematic diagram of a power module in FIG. 1 and a sectional plan along A-A line therein.
Figure 2B:
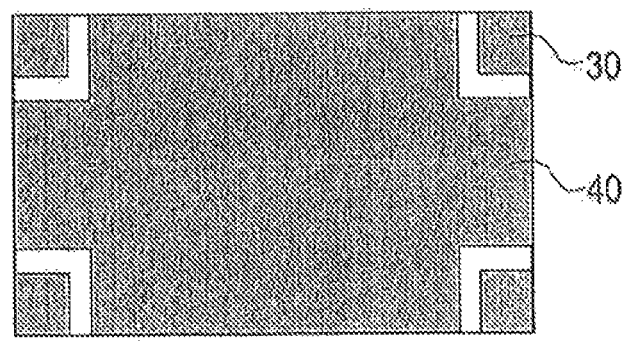

FIG. 2A is a schematic diagram, of the power module 100. FIG. 2B is a sectional plan along A-A line in FIG. 2A. The power module 100 includes a heat radiation substrate 10, an insulated substrate 20, a first joint unit 30, a second joint unit 40, a sensor 110, a first device 50, a second device 60, a wire 70, a housing 80, and a silicon gel 90.

For example, the heat radiation substrate is a plate formed by metal material such as copper (thermal conductivity $k \approx 400$ W/(mk)) and having superior thermal conductivity. The heat radiation substrate 10 includes an opening for fasten fixing, and is fixed with a heat sink 130 by a fastening device 120 such as a bolt. By conducting heat into the heat sink 130, the heat radiation substrate 10 loses heat from the power module 100. Hereinafter, as to a face of the heat radiation substrate 10 opposite to the heat sink 130, a reverse face of the heat radiation substrate 10 is called a surface (the first face).

For example, the insulated substrate 20 is formed by material such as ceramic. On a surface of the insulated substrate 20, wired patterns are formed with conductive material such as copper or tungsten. The insulated substrate 20 is disposed (located) on the first joint unit 30 and the second joint unit 40 (each joint unit will be explained afterwards) by facing the back thereof to the surface of the heat radiation substrate 10. The insulated substrate 20 is a rectangular substrate and has a corner region at the four corners. Here, the corner region is a part where two sides along different directions of the insulated substrate 20 cross. The back of the insulated substrate 20 includes a region (first region) including the corner region on the first joint unit 30 and a region (second region) on the second joint unit 40. Briefly, the first region is jointed with a first face of the heat radiation substrate 10 via the first joint unit 30, and the second region is jointed with the first face of the heat radiation substrate 10 via the second joint unit 40. Furthermore, a surface (the reverse face of the back) of the insulated substrate 20 includes a region (third region) opposite to the first region and a region (fourth region) opposite to the second region. Moreover, for example, areas and shapes of the first region (the third region) and the second region (the fourth region) are arbitrarily determined in a range to satisfy the prescribed radiation performance of the electronic apparatus 1. The insulated substrate 20 maintains an electric connection of the power module 100 and an electronic connection between the power module 100 and the outside.

The first joint unit 30 is a membrane device to joint the first face of the heat radiation substrate 10 and the first region of the back of the insulated substrate 20. The second joint unit 40 is a membrane device to joint the first face of the heat radiation substrate 10 and the second region of the back of the insulated substrate 20 by spacing (separating) from the first joint unit 30 along a face direction of the heat radiation substrate 10 or the insulated substrate 20. A joint area of the second joint unit 40 is larger than a joint area of the first joint unit 30. Moreover, the joint area is an area where the first joint unit 30 is jointed with the first face of the heat radiation substrate 10 or the back of the insulated substrate 20, or an area where the second joint unit 40 is jointed with the first face of the heat radiation substrate 10 or the back of the insulated substrate 20. In the first embodiment, as a material of the first joint unit 30 and the second joint unit 40, a solder including an alloy of a tin and a lead can be used. Moreover, for example, the first joint unit 30 and the second joint unit 40 are formed by reflow method.

Moreover, for example, when the first face of the heat radiation substrate 10 or the back of the insulated substrate 20 is coated with gold plating for oxidation prevention, or when an electrode pad is disposed on the first face of the heat radiation substrate 10 or the back of the insulated substrate 20 for electric connection, different devices such as the coating material or the electrode pad can be included in the first joint unit 30 and the second joint unit 40.

The sensor 110 measures a time series of acceleration due to vibration (including disturbance such as impact) constantly applying to the insulated substrate 20 (the first joint unit 30). The time series of acceleration measured by the sensor 110 is stored into the storage apparatus 300. As the sensor 110, for example, an acceleration sensor of piezoelectric type or electrostatic type, or an acceleration sensor of MEMS (Micro Electro Mechanical Systems) type, can be used. The sensor 110 is disposed adjacent to the first joint unit 30 than the second joint unit 40 on the surface of the insulated substrate 20, more preferably, on any of the third regions.

The first element 50 is disposed on the fourth region of the surface of the insulated substrate 20, for example, a power element such as IGET (Insulated Gate Bipolar Transistor). The first element 50 is jointed with the insulated substrate 20 by solder joint. On a surface of the first element 50, a plurality of electrodes is formed.

The second element 60 is disposed on the fourth region of the surface of the insulated substrate 20 and, for example, a diode having rectification. The second element 60 is jointed with the insulated substrate 20 by solder joint. On a surface of the second element 60, a plurality of electrodes is formed.

Moreover, the second element is not limited to the diode. Various elements electrically connected to the first element 50 can be used as the second element 60.

The wire 70 is a conductive device to electrically connect between an electrode of the first element 50 and an electrode of the second element 60. As a material of the wire 70, for example, aluminum can be used. For example, the wire 70 is jointed with each electrode by ultrasonic wave joint.

The housing 80 is a case of the power module 100. As a material thereof, for example, a resin is used. In the housing 80, the insulated substrate 20, the first element 50, the second element 60, and the wire 70, are received.

The silicon gel 90 is potted in the housing 80, and covers at least the wire 70. The silicon gel 90 prevents shot due to contact between adjacent wires 70, degradation due to environmental change such as moisture, or characteristic change.

Moreover, here, the silicon gel is explained as an example. However, a gel device having at least insulation characteristic and mechanical intensity to prevent moving of the wire 70 due to vibration, for example, Young's modulus 1 kPa~1 MPa, may be used.

(Explanation of Failure Occurrence Mode)

In this power module 100, while the electronic apparatus 1 is being operated, the first element 50 or the second element 60 generates a heat, and the heat is supplied to each component device of the power module. Here, heat expansion coefficients of each component device of the power module 100 are different. Accordingly, for example, shearing force applies to a joint face between the heat radiation substrate 10 and the first joint unit 30 or the second joint unit 40, or a joint face between the insulated substrate 20 and the first joint unit 30 or the second joint unit 40. The shearing force is larger at a peripheral region of which expansion amount is larger in comparison with a center region of the insulated substrate 20. More in detail, in the peripheral region, the shearing force is more larger at a corner region of which distance from the center of the insulated substrate is longest.

Furthermore, when disturbance such as vibration or impact is applied to the electronic apparatus 1, deflection of which support point is the fastening device 120 occurs at the heat radiation substrate 10. In this case, at the heat radiation substrate 10 (as free end) or the peripheral region (especially, the corner region) of the insulated substrate 20, force is added along a direction to separate the insulated substrate 20 from the heat radiation substrate 10.

Accordingly, in the power module 100, in comparison with the second junction unit 40 joining the first face of the heat radiation substrate 10 with the third face disposed at a center of the insulated substrate 20, a larger load is applied to the first joint unit 30 joining the first face of the heat radiation substrate 10 with the second face including the corner region of the insulated substrate 20. As a result, failure such as occurrence of crack or cracking of the first joint unit 30 and the second joint unit 40 from the heat radiation substrate 10 or the insulated substrate 20 firstly appears at the first joint unit 30. Then, the failure gradually extends all parts of the first joint unit 30. Last, when the failure so extends that safety to operate the electronic apparatus 1 is influenced, the first joint unit 30 is broken. After that, similar failure occurs at the second joint unit 40. Moreover, this failure is a joint failure between the first joint unit 30 and the heat radiation substrate 10 or the insulated substrate 20, or a joint failure between the second joint unit 40 and the heat radiation substrate 10 or the insulated substrate 20.

When heat is lost from the first element 50 and the second element 60 to the heat sink 130, the first joint unit 30 and the second joint unit 40 (each joining the heat radiation substrate 10 and the insulated substrate 20) have an important job to secure radiation performance of the electronic apparatus 1. Accordingly, occurrence of failure at the first joint unit 30 and the second joint unit 40 is not desirable in order to keep radiation performance of the electronic apparatus 1.

Accordingly, in the first embodiment, the sensor 110 is disposed on the third region of the surface of the insulated substrate 20. As a result, influence of component change due to failure of the first joint unit 30 can be quickly and effectively detected by acceleration.

Figure 3:
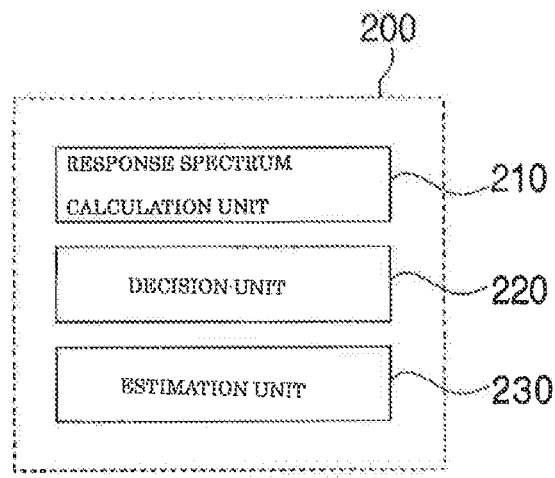
FIG. 3 is a block diagram of an operation processing apparatus in FIG. 1.

FIG. 3 is a block diagram of the operation processing apparatus 200. The operation processing apparatus 200 includes a first calculation unit (response spectrum calculation unit) 210, a decision unit 220, and an estimation unit 230 as respective modules.

By using the time series of acceleration (detected by the sensor 110) stored in the storage apparatus 300, for example, the response spectrum calculation unit 210 calculates a (acceleration) response spectrum at a predetermined period Ts. Moreover, concretely, the response spectrum calculation unit 210 acquires response spectrums by executing Fast Fourier Transform to the time series of acceleration measured by the sensor 110. Furthermore, if necessary, for example, by calculating a moving average of a predetermined frequency band on a frequency axis, the response spectrum calculation unit 210 smoothes the response spectrum. In this way, the response spectrum calculated by the response spectrum calculation unit 210 is stored into the storage apparatus 300.

Figure 4:
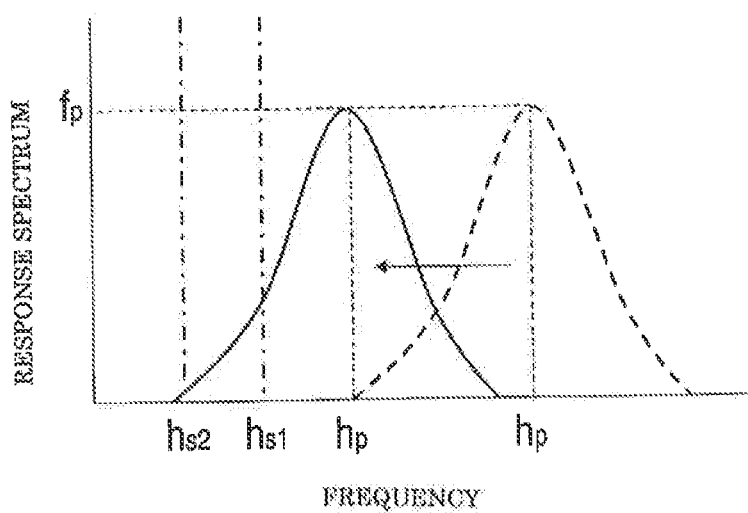
FIG. 4 is a graph showing a response spectrum according to the first embodiment.

FIG. 4 is a graph showing the response spectrum calculated by the response spectrum calculation unit 210. Here, as shown in FIG. 4, a maximum peak of the response spectrum is and a frequency (maximum peak frequency) corresponding to the maximum, peak is $h_p$.

When failure such as crack occurs at the first joint unit 30, stiffness of the first joint unit 30 falls. In this case, with falling of stiffness of the first joint unit 30, resonant frequency of the insulated substrate 20 and the first joint unit 30 also falls. Accordingly, as shown in FIG. 4, while the failure is extending at the first joint unit 30, a peak frequency $h_p$ of the response spectrum gradually moves to a low frequency side.

Based on the response spectrum calculated by the response spectrum calculation unit 210, the decision unit 220 decides an extension status of failure of the first joint unit 30. The extension status represents a level of extension of failure, and is defined in correspondence with a response spectrum of a predetermined reference. Here, as the extension status of failure of the first joint unit 30, a previous status of break which the failure so extends that a predetermined performance (heat radiation performance) of the electronic apparatus 1 cannot be acquired may be decided. Alternatively, by previously prescribing a range of extension status of failure to keep safety to operate the electronic apparatus 1, a break status may be decided.

Concretely, the decision unit 220 acquires the response spectrum at a period $T_s$ from the storage apparatus 300, and detects a peak frequency $h_p$ of the response spectrum. Then, for example, by calculating a change amount of the peak frequency $h_p$ at the period $T_s$, the decision unit 220 measures change of the peak frequency $h_p$ of the response spectrum in order. For example, by comparing the peak frequency $h_p$ of the response spectrum with a threshold $h_s1$ (first reference frequency) of frequency, when the peak frequency $h_p$ is below the threshold $h_s1$ the decision unit 220 decides that the first joint unit 30 is under a previous status of break. Furthermore, when the peak frequency $h_p$ is below another threshold $h_s2$ (second reference frequency) not higher than the threshold $h_s1$, the decision unit 220 decides that the first joint unit 30 is under a break status.

Based on a decision result of the decision unit 220, the estimation unit 230 estimates a break status of the second joint unit 40. Concretely, when the decision unit 220 decides that the first joint unit 30 is under a break status, by regarding the second joint unit 40 as a status that failure has extended, the estimation unit 230 estimates that a joint status of the second joint unit 40 is broken. Briefly, in the first embodiment, at timing when the estimation unit 230 estimates a break status of the second joint unit 40, the electronic apparatus 1 is decided to be failed.

The output apparatus 400 notifies a user of an estimation result of the estimation unit 230, for example, by an alarm. As a result, before the electronic apparatus 1 completely stops operation by failure, the user can be aroused to pay attention and urged to repair the electronic apparatus 1.

According to the electronic apparatus 1 of the first embodiment, different from the case of general solder ball joint, the first joint unit 30 and the second joint unit 40 as a solder layer (having face jointed) are targeted. Accordingly, a situation that the response spectrum is shifted due to extension of failure is detected as a time series. As mentioned-above, by setting a threshold at each phase of extension of failure, the user can certainly know extension of failure of the first joint unit 30 and the second joint unit 40. As a result, reliability of solder joint between the heat radiation substrate 10 and the insulated substrate 20.

(Modification)

Figure 5:
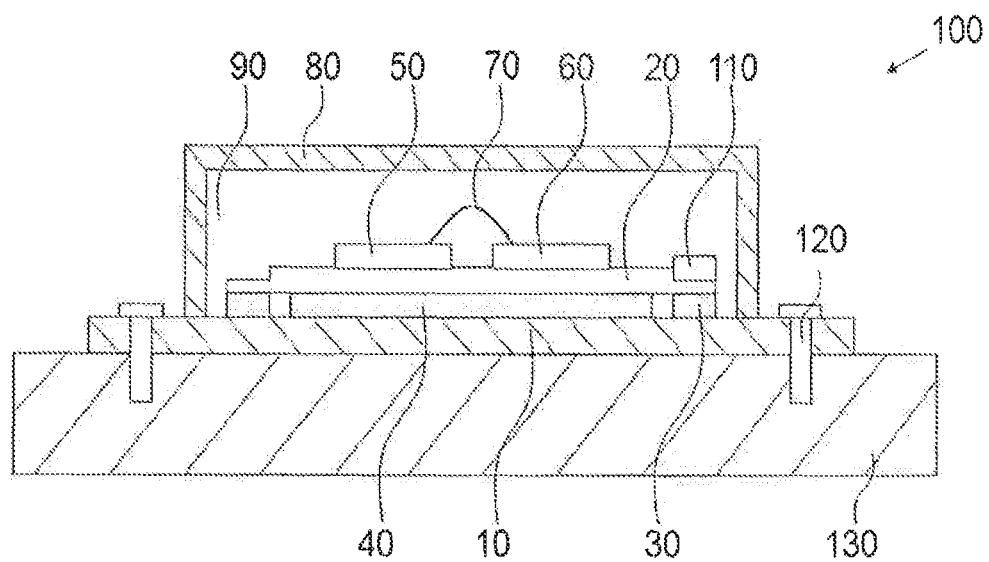
FIG. 5 is a schematic diagram of the power module according to a modification of the first embodiment.

FIG. 5 is a schematic diagram of the power module 100 according to a modification of the first embodiment.

In FIG. 5, the power module 100 includes an insulated substrate 20 of which thickness on the first joint unit 30 is thinner than thickness on the second joint unit 40. Moreover, other components are same as the power module 100 of FIG. 2. Accordingly, detail explanation thereof is omitted.

In this modification, thickness of the insulated substrate 20 is thin on the first joint unit 30. In this case, stiffness of the insulated substrate 20 falls. Accordingly, amplitude of the response spectrum of acceleration measured by the sensor 110 is larger in comparison with the first embodiment. As a result, a peak $f_p$ of the response spectrum becomes large.

Moreover, as this thickness, an average of distances between the surface and the back of the insulated substrate 20 can be used. For example, at a plurality of points in a face of the insulated substrate 20, by measuring distances between the surface and the back, this average is calculated.

As a result, when crack occurs or extends, change of the response spectrum notably appears. By detecting shift of peak of the response spectrum, extension of crack can be easily decided. Briefly, when the decision unit 220 decides extension status of failure of the first joint unit 30 as break or previous status thereof, accuracy of this decision is raised.

The Second Embodiment

Figure 6:
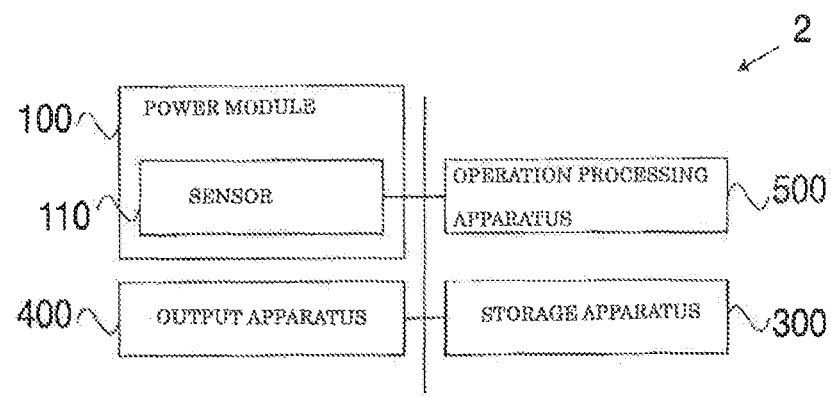
FIG. 6 is a block diagram of the electronic apparatus according to a second embodiment.
Figure 7:
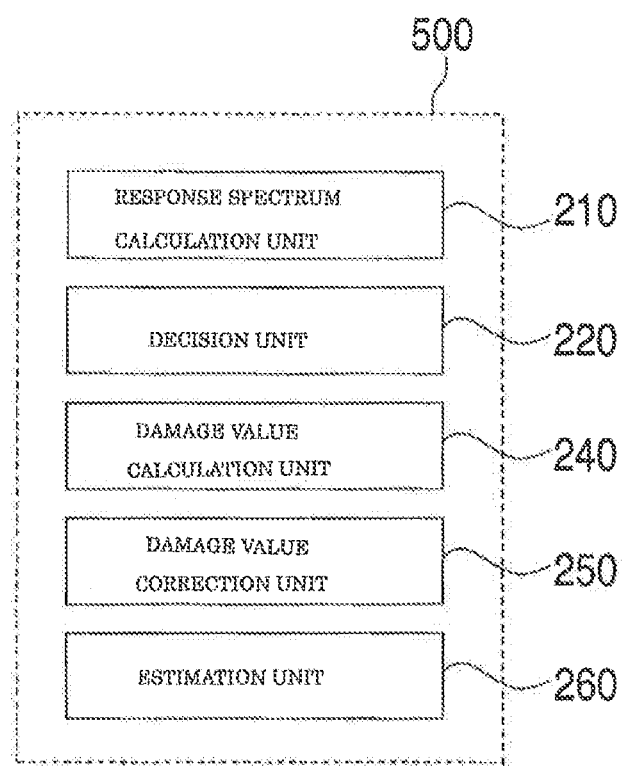
FIG. 7 is a block diagram of an operation processing apparatus in FIG. 6.

FIG. 6 is a block diagram of an electronic apparatus 2 according to the second embodiment. FIG. 7 is a block diagram of an operation processing apparatus 500. In FIG. 7, the operation processing apparatus 500 includes a second calculation unit (damage value calculation unit) 240, a correction unit (damage value correction unit) 250, and an estimation unit 250. These units are different from the operation processing apparatus 200. Moreover, as to the same components as the electronic apparatus 1 of the first embodiment, the same sign is added, and detail explanation thereof is omitted.

In the second embodiment, by previously executing a numerical structure analysis or an examination for the electronic apparatus 2, relationship between load added to the first joint unit 30 and failure occurred at the first joint unit 30, and relationship between load added to the second joint unit 40 and failure occurred at the second joint unit 40, are stored into the storage apparatus 300. Moreover, this load is acceleration or temperature affecting on change of internal stress of the second joint unit 40. Furthermore, as the relationship between the load and the failure, for example, an equation related to the damage value defined as following is used.

When a load is repeatedly added to the first joint unit 30 and the second joint unit 40 at one cycle, the damage value thereof is represented as a reciprocal number of the number of cycles of fatigue life by assuming that the same load is repeatedly added every one cycle. Accordingly, when a load is repeatedly added to the first joint unit 30 and the second joint unit 40 every one cycle, a damage value thereof is calculated by accumulating the damage value calculated at each cycle. In proportion to increase of the damage value accumulated, failure more extends at the first joint unit 30 and the second joint unit 40. Then, when the damage value accumulated is equal to 1, the first joint unit 30 and the second joint unit 40 are broken. Briefly, this damage value is an index representing an extension status of failure in the first joint unit 30 and the second joint unit 40.

However, actually, due to influence of individual difference of the first joint unit 30 and the second joint unit 40, before and after the damage value accumulated is equal to 1 as a predicted damage value to break, the first joint unit 30 and the second joint unit 40 are often broken. Accordingly, at timing when the decision unit 220 decides that the first joint unit 30 is broken (the electronic apparatus 2 has failed), the damage value accumulated for the second joint unit 40 is corrected.

By using the time series of acceleration (measured by the sensor 110) stored into the storage apparatus 300, the damage value calculation unit 240 respectively calculates a damage value of the first joint unit 30 and the second joint unit 40 every predetermined period.

By comparing a predicted damage value for the first joint unit 30 to break with a damage value of the first joint unit 30 calculated by the damage value calculation unit 240 when the decision unit 220 decides that the first joint unit 30 is broken, the damage value correction unit 250 calculates an error of the damage value of the first joint unit 30. Then, by assuming that the second joint unit 40 has the same error as the first joint unit 30, the damage value correction unit 250 corrects the damage value (calculated by the damage value calculation unit 240) of the second joint unit 40 by using the error.

By using the damage value (calculated by the damage value calculation unit 240) of the second joint unit 40 or the damage value (corrected by the damage value correction unit 250) of the second joint unit 250, the estimation unit 260 estimates a fatigue life of the second joint unit 40, i.e., a fatigue life of the electronic apparatus 2. Here, the fatigue life represents a period until the second joint unit 40 is broken. For example, the fatigue life is represented as the number of cycles of loads or a time until the second joint unit 40 is broken.

For example, relationship between the number of cycles of load and the damage value is stored as a database into the storage apparatus 300. By referring to this database, the number of cycles remained until the damage value is equal to 1 is regarded as the fatigue life. Alternatively, when the same load is repeatedly added, assume that the damage value increases with the same tendency as the past, and a time series of the damage value is stored in the storage apparatus 300. By applying algorithm (such as least squares method) to the time series, a predicted equation to calculate a predicted time to the break is acquired. The predicted time calculated by the predicted equation is set to the fatigue life.

Figure 8:
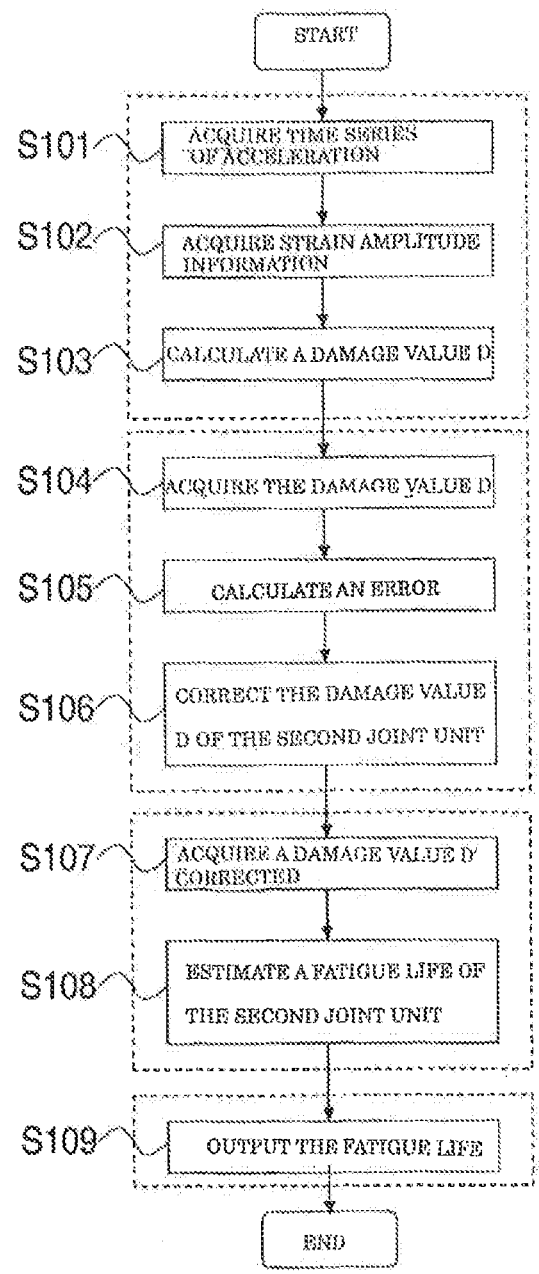
FIG. 8 is a flow chart of processing of fatigue life estimation method according to the second embodiment.

Hereinafter, by referring to a flow chart of FIG. 8, method for estimating a fatigue life is explained.

The damage value calculation unit 240 acquires the time series of acceleration (measured by the sensor 110) stored in the storage apparatus 300 (S101). This acceleration is regarded to similarly apply to the first joint unit 30 and the second joint unit 40.

Figure 9:
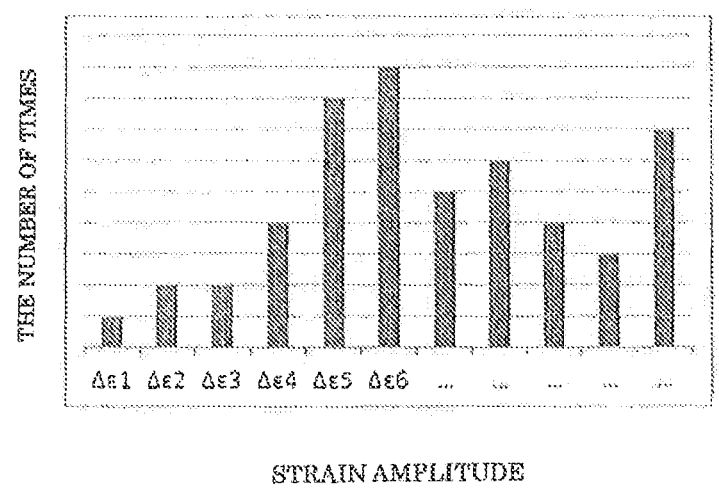
FIG. 9 is a graph showing one example of strain amplitude according to the second embodiment.

By using the time series of acceleration, for example, the damage value calculation unit 240 counts the number of cycles of an acceleration amplitude by algorithm such as cycle count. Furthermore, from the relationship between the acceleration amplitude and strain amplitude previously stored in the storage apparatus 300, the damage value calculation unit 240 acquires information of the strain amplitude shown in FIG. 9.

By using the strain amplitude, the damage value calculation unit 240 calculates a damage value D of the first joint unit 30 and the second joint unit 40 by following equation (1). In the equation (1), $N_f$ is the number of cycles (of fatigue life) of the strain amplitude $\Delta\epsilon$ to the break. Furthermore, $\alpha$ and $\beta$ are parameters representing damage characteristic of a material and having a value peculiar to the material.

$$N_{f1} = \alpha \cdot \Delta\epsilon_1^{-\beta}$$

$$D = 1/N_{f1} + 1/N_{f2} + \ldots 1/N_{f1} + N_{fn} \qquad (1)$$

The damage value D calculated by the damage value calculation unit 240 is stored into the storage apparatus 300.

The damage value correction unit 250 acquires the damage value D (calculated by the damage value calculation unit 240) of the first joint unit 30 and the second joint unit 40 (S104).

When the decision unit 220 decides that the first joint unit 30 is broken, a predicted damage value to the break is 1. Accordingly, the damage value correction unit 250 calculates a reciprocal number 1/D of the damage value D of the first joint unit 30 as an error of the damage value D (S105).

By assuming that the second joint unit 40 has the same error as the first joint unit 30, the damage value correction unit 250 corrects the damage value D of the second joint unit 40 by multiplying the error (calculated at S105) with the damage value D of the second joint unit 40 (S106). A damage value D' (corrected by the damage value correction unit 250) of the second joint unit 40 is stored into the storage apparatus 300.

The estimation unit 260 acquires the damage value D' (corrected by the damage value correction unit 250) of the second joint unit 40 (S107).

By referring to the database of relationship between the number of cycles of loads and the damage value stored in the storage apparatus 300, the estimation unit 260 estimates a fatigue life of the second joint unit 40 (the electronic apparatus 2) (S108). The fatigue life estimated by the estimation unit 260 is stored into the storage apparatus 300.

The output apparatus 400 outputs the fatigue life (estimated by the estimation unit 260) of the second joint unit 48 (S109). For example, the output apparatus 400 notifies a user via a display.

Moreover, the estimation unit 260 may estimate the fatigue life as a time until the second joint unit 40 is broken. Furthermore, the estimation unit 260 may estimate the fatigue life of the second joint unit 48 using not the damage value corrected by the damage value correction unit 250 but the damage value calculated by the damage value calculation unit 240. Furthermore, in the second embodiment, in order to calculate the damage value, the time series of acceleration measured by the sensor 110 is used. However, by preparing a temperature sensor in addition to the sensor 110, a load such as a temperature measured by the temperature sensor may be used.

According to the electronic apparatus 2 of the second embodiment, by using the damage value corrected, influence due to individual difference of the second joint unit 40 is taken into consideration. Accordingly, in comparison with the first embodiment, reliability of solder joint can be further raised.

As mentioned-above, according to at least one of the electronic apparatus, the break estimation method, and the fatigue life estimation method, reliability of solder joint can be raised.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a heat radiation substrate;
a first joint unit disposed on the heat radiation substrate;
a second joint unit disposed on the heat radiation substrate by spacing from the first joint unit, a joint area of the second joint unit being larger than a joint area of the first joint unit;
an insulated substrate disposed on the first joint unit and the second joint unit, a corner region of the insulated substrate contacting with the first joint unit;
a first sensor to measure an acceleration of vibration applied to the insulated substrate, disposed on the insulated substrate, the first sensor being more adjacent to the first joint unit than the second joint unit;
a first calculation unit configured to calculate a response spectrum of the acceleration;
a decision unit configured to decide an extension status of joint failure of the first joint unit by comparing a frequency of a maximum peak of the response spectrum with a reference frequency; and
an estimation unit configured to estimate a break of the second joint unit based on the extension status.

2. The electronic apparatus according to claim 1, wherein a thickness of the corner region of the insulated substrate is thinner than a thickness of other regions of the insulated substrate.

3. The electronic apparatus according to claim 1, wherein the decision unit decides that the first joint unit is under a previous status of break when the frequency of the maximum peak is not higher than a first reference frequency, and decides that the first joint unit is broken when the frequency of the maximum peak is not higher than a second reference frequency lower than the first reference frequency.

4. The electronic apparatus according to claim 3, further comprising
a second sensor to measure a time series of a load applied to the first joint unit and the second joint unit;
a second calculation unit configured to calculate a first damage value of the first joint unit and a second damage value of the second joint unit using the time series;
a third calculation unit configured to, when the decision unit decides that the first joint unit is broken, calculate an error of the first damage value by comparing the first damage value with a first damage value at timing that the first joint unit is broken; and a correction unit configured to calculate a third damage value by correcting the second damage value using the error;
wherein the estimation unit estimates a fatigue life until the second joint unit is broken by comparing the third damage value with a second damage value at timing that the second joint unit is broken.

5. The electronic apparatus according to claim 1, further comprising:
an output unit to output an estimated result that the second joint unit is broken by the estimation unit.

6. The electronic apparatus according to claim 4, further comprising:
an output unit to output the fatigue life estimated by the estimation unit.

7. A method for estimating a break in an electronic apparatus, the electronic apparatus comprising
a heat radiation substrate;
a first joint unit disposed on the heat radiation substrate;
a second joint unit disposed on the heat radiation substrate by spacing from the first joint unit, a joint area of the second joint unit being larger than a joint area of the first joint unit;
an insulated substrate disposed on the first joint unit and the second joint unit, a corner region of the insulated substrate contacting with the first joint unit; and
a first sensor to measure an acceleration of vibration applied to the insulated substrate, disposed on the insulated substrate, the first sensor being more adjacent to the first joint unit than the second joint unit;
wherein the method comprises
calculating a response spectrum of the acceleration;
deciding an extension status of joint failure of the first joint unit by comparing a frequency of a maximum peak of the response spectrum with a reference frequency; and
estimating a break of the second joint unit based on the extension status.

8. A method for estimating a fatigue life in an electronic apparatus, the electronic apparatus comprising
a heat radiation substrate;
a first joint unit disposed on the heat radiation substrate;
a second joint unit disposed on the heat radiation substrate by spacing from the first joint unit, a joint area of the second joint unit being larger than a joint area of the first joint unit;
an insulated substrate disposed on the first joint unit and the second joint unit, a corner region of the insulated substrate contacting with the first joint unit;
a first sensor to measure an acceleration of vibration applied to the insulated substrate, disposed on the insulated substrate, the first sensor being more adjacent to the first joint unit than the second joint unit; and
a second sensor to measure a time series of a load applied to the first joint unit and the second joint unit;
wherein the method comprises
calculating a response spectrum of the acceleration;
deciding an extension status of joint failure of the first joint unit by comparing a frequency of a maximum peak of the response spectrum with a reference frequency;
calculating a first damage value of the first joint unit and a second damage value of the second joint unit using the time series;
calculating, when the deciding decides that the first joint unit is broken, an error of the first damage value by comparing the first damage value with a first damage value at timing that the first joint unit is broken;

calculating a third, damage value by correcting the second damage value using the error; and estimating a fatigue life until the second joint unit is broken by comparing the third damage value with a second damage value at timing that the second joint unit is broken.

* * * * *